United States Patent
Tate, Jr. et al.

(10) Patent No.: US 6,653,817 B2
(45) Date of Patent: Nov. 25, 2003

(54) STATE-OF-CHARGE DETECTION DEVICE FOR A BATTERY

(75) Inventors: Edward Dean Tate, Jr., Grand Blanc, MI (US); Mark William Verbrugge, Troy, MI (US); Shawn D. Sarbacker, Royal Oak, MI (US)

(73) Assignee: General Motors Corporation, Detroit, MI (US)

( * ) Notice: Subject to any disclaimer, the term of this patent is extended or adjusted under 35 U.S.C. 154(b) by 17 days.

(21) Appl. No.: 09/891,878

(22) Filed: Jun. 26, 2001

(65) Prior Publication Data

US 2002/0196027 A1 Dec. 26, 2002

(51) Int. Cl.[7] .......................... H02V 7/00; G01N 27/416
(52) U.S. Cl. ....................... 320/132; 320/134; 320/136; 324/427; 324/430; 702/63
(58) Field of Search ................................ 320/132, 134, 320/136; 324/427, 430; 702/63

(56) References Cited

U.S. PATENT DOCUMENTS

| 5,281,920 | A | * | 1/1994 | Wurst ......................... 324/430 |
| 5,457,377 | A | * | 10/1995 | Jonsson ....................... 324/430 |
| 5,598,098 | A | * | 1/1997 | Champlin .................... 324/430 |
| 6,002,238 | A | * | 12/1999 | Champlin .................... 320/134 |
| 6,194,874 | B1 | * | 2/2001 | Kalogeropoulos et al. .. 320/160 |
| 6,208,147 | B1 | * | 3/2001 | Yoon et al. .................. 324/430 |
| 6,262,563 | B1 | * | 7/2001 | Champlin .................... 320/134 |
| 6,362,598 | B2 | * | 3/2002 | Laig-Horstebrock et al. .... 320/132 |
| 6,417,669 | B1 | * | 7/2002 | Champlin .................... 324/426 |
| 6,456,988 | B1 | * | 9/2002 | Singh et al. ................... 706/2 |

FOREIGN PATENT DOCUMENTS

| GB | 2175700 A | * | 12/1986 | .......... G01R/31/36 |
| WO | WO 9322666 A1 | * | 11/1993 | ......... G01N/27/416 |

* cited by examiner

Primary Examiner—Gregory J. Toatley, Jr.
(74) Attorney, Agent, or Firm—Christopher DeVries

(57) ABSTRACT

A method and apparatus for improving estimation of battery impedance when determining the state of charge of a battery including injecting a wide spectrum signal continuously across a battery when the battery is in generator mode. Additionally, the wide spectrum signal may be injected across an alternator of a conventional internal combustion engine to improve estimation of battery impedance and subsequent state of charge the battery.

28 Claims, 3 Drawing Sheets

STATE-OF-CHARGE DETECTION DEVICE FOR A BATTERY

TECHNICAL FIELD

The present invention relates to a method and apparatus for determining the state of a battery. More specifically, the present invention relates to a method for improving estimation of battery states including state of charge, internal impedance and state of health.

BACKGROUND OF THE INVENTION

In today's automotive market, there exists a variety of propulsion or drive technologies used to power vehicles. The technologies include internal combustion engines (ICEs), electric drive systems utilizing batteries and/or fuel cells as an energy source, and hybrid systems utilizing a combination of internal combustion engines and electric drive systems. The propulsion systems each have specific technological, financial, and performance advantages and disadvantages, depending on the state of energy prices, energy infrastructure developments, environmental laws, and government incentives.

The increasing demand to improve fuel economy and reduce emissions in present vehicles has led to the development of advanced hybrid vehicles. Hybrid vehicles are classified as vehicles having at least two separate power sources, typically an internal combustion engine and an electric traction motor. Hybrid vehicles, as compared to standard vehicles driven by an ICE, have improved fuel economy and reduced emissions. During varying driving conditions, hybrid vehicles will alternate between separate power sources, depending on the most efficient manner of operation of each power source. For example, a hybrid vehicle equipped with an ICE and an electric motor will shut down the ICE during a stopped or idle condition, allowing the electric motor to propel the vehicle and eventually restart the ICE, improving fuel economy for the hybrid vehicle.

Hybrid vehicles are broadly classified into series or parallel drivetrains, depending upon the configuration of the drivetrains. In a series drivetrain utilizing an ICE and an electric traction motor, only the electric motor drives the wheels of a vehicle. The ICE converts a fuel source to mechanical energy to turn a generator that converts the mechanical energy to electrical energy to drive the electric motor. In a parallel hybrid drivetrain system, two power sources such as an ICE and an electric traction motor operate in parallel to propel a vehicle. Generally, a hybrid vehicle having a parallel drivetrain combines the power and range advantages of a conventional ICE with the efficiency and electrical regeneration capability of an electric motor to increase fuel economy and lower emissions, as compared with a traditional ICE vehicle.

Battery packs having secondary/rechargeable batteries are an important component of hybrid or electrical vehicle systems, as they enable an electric motor/generator (MoGen) to store braking energy in the battery pack during regeneration and charging by the ICE. The MoGen utilizes the stored energy in the battery pack to propel or drive the vehicle when the ICE is not operating. During operation, the ICE will be shut on and off intermittently, according to driving conditions, causing the battery pack to be constantly charged and discharged by the MoGen. The state of charge (SOC, defined as the percentage of the full capacity of a battery that is still available for further discharge) is used to regulate the charging and discharging of the battery.

Rechargeable batteries are also an important component in other applications where a battery pack is continually cycled, such as in solar-powered battery packs for satellites, portable communication apparatus, laptop computers and wireless transceivers such as those used in radios, cell phones, pagers, etc.

The preferred embodiment of the present invention utilizes a nickel metal hydride (NiMH) battery in the battery pack. A NiMH battery stores hydrogen in a metal alloy. When a NiMH cell is charged, hydrogen generated by the cell electrolyte is stored in the metal alloy (M) in the negative electrode. Meanwhile, at the positive electrode, which typically consists of nickel hydroxide loaded in a nickel foam substrate, a hydrogen ion is ejected and the nickel is oxidized to a higher valency. On discharge, the reactions reverse. The reaction at the negative electrode is more clearly shown by the following reaction diagram:

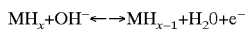

The discharging direction is represented by $\rightarrow$. The charging direction is represented by $\leftarrow$.

On discharge, OH— ions are consumed at the negative hydride electrode and generated at the nickel oxide positive electrode. The converse is true for the water molecules.

A difficulty with NiMH batteries is predicting their SOC because of the charging and discharging characteristics of NiMH battery technology. Referring to FIG. 1, typical charge increasing 10 and charge decreasing 12 curves are illustrated for a NiMH battery. Referencing points A and B and points C and D, it can be shown that the voltages are the same while the SOCs are substantially different. Thus, it is very difficult to use an open circuit voltage to accurately predict the SOC of the NiMH battery, as the battery operating operation (charge increasing, charge sustaining or charge decreasing) must be known. Furthermore, coulombic integration methods to determine the SOC of a battery suffer from accumulated errors. When used with a hybrid vehicle, the intermittent charging and discharging of the battery pack amplifies the problems associated with predicting the SOC of a NiMH battery back. To successfully operate a hybrid powertrain of a vehicle incorporating a battery pack, an accurate and repeatable estimate of battery SOC is needed.

Furthermore, charging on hybrid vehicle battery systems has traditionally been fairly static and controlled to a fixed setpoint. The constant power/current in hybrid vehicle usage makes it difficult to estimate battery impedance.

SUMMARY OF THE INVENTION

The present invention includes a method to determine the state of a battery, a battery, and an apparatus that can be controlled to affect either the current or voltage at the terminals of the battery. The method to estimate the state may estimate the state of charge, state of health and power capability of the battery. The battery may be a single cell, a battery of cells or a pack of batteries. The preferred battery utilizes NiMH chemistries. However, any other battery technology known in the art such as lead acid, lithium polymer, etc., can be used. The apparatus may consist of a power source that can be varied, or a load that can be varied in a controlled manner. Examples of power sources include generators in a conventional vehicle, the generators in a hybrid vehicle, the charger for an EV, and the charger in consumer electronics. Examples of loads include DC/DC converters in a vehicle, an electrically driven compressor in a vehicle, and the processor in a laptop computer.

The method of the present invention includes introducing a wide spectrum signal (i.e., white noise, white light) into the charging set point of a battery, causing the current to constantly change at the terminals of the battery. The resulting signal is then passed to the charge control logic of the electrical control system utilized to propel a vehicle. The resulting signal provides the control logic with an improved ability to identify the impedance, open circuit voltage, SOC, and power limits of the battery pack.

The present invention further includes a vehicle having both parallel and series hybrid drive systems incorporating a hybrid system controller executing the methods of the present invention, an ICE, and a MoGen that charges and discharges the battery pack. The MoGen not only provides for propulsion of the vehicle during certain vehicle operating conditions but also replaces an alternator to charge the battery pack in the vehicle and replaces a conventional starter motor to start the ICE. The hybrid drive system of the present invention will utilize the ICE and MoGen to propel or motor the vehicle during the vehicle conditions that are most efficient for the ICE or MoGen operation. The transfer of power between the MoGen and ICE or vice versa is transparent to the operator or driver, as the vehicle will perform as if there is only one drive system propelling the vehicle.

During normal operation of the vehicle when the ICE is running, the MoGen will act as an electrical generator to supply electrical power to the vehicle's electrical infrastructure (fans, radios, instrumentation, control, etc.) as well as recharging the battery pack. The battery pack and a power transfer device, such as a DC-DC converter, will supply power to the vehicle electrical infrastructure and power the MoGen when it is operating as the motoring device for the vehicle. In the motoring mode, the MoGen is an electrical load drawing current from the battery pack.

DESCRIPTION OF THE PREFERRED EMBODIMENT

Figure 1:
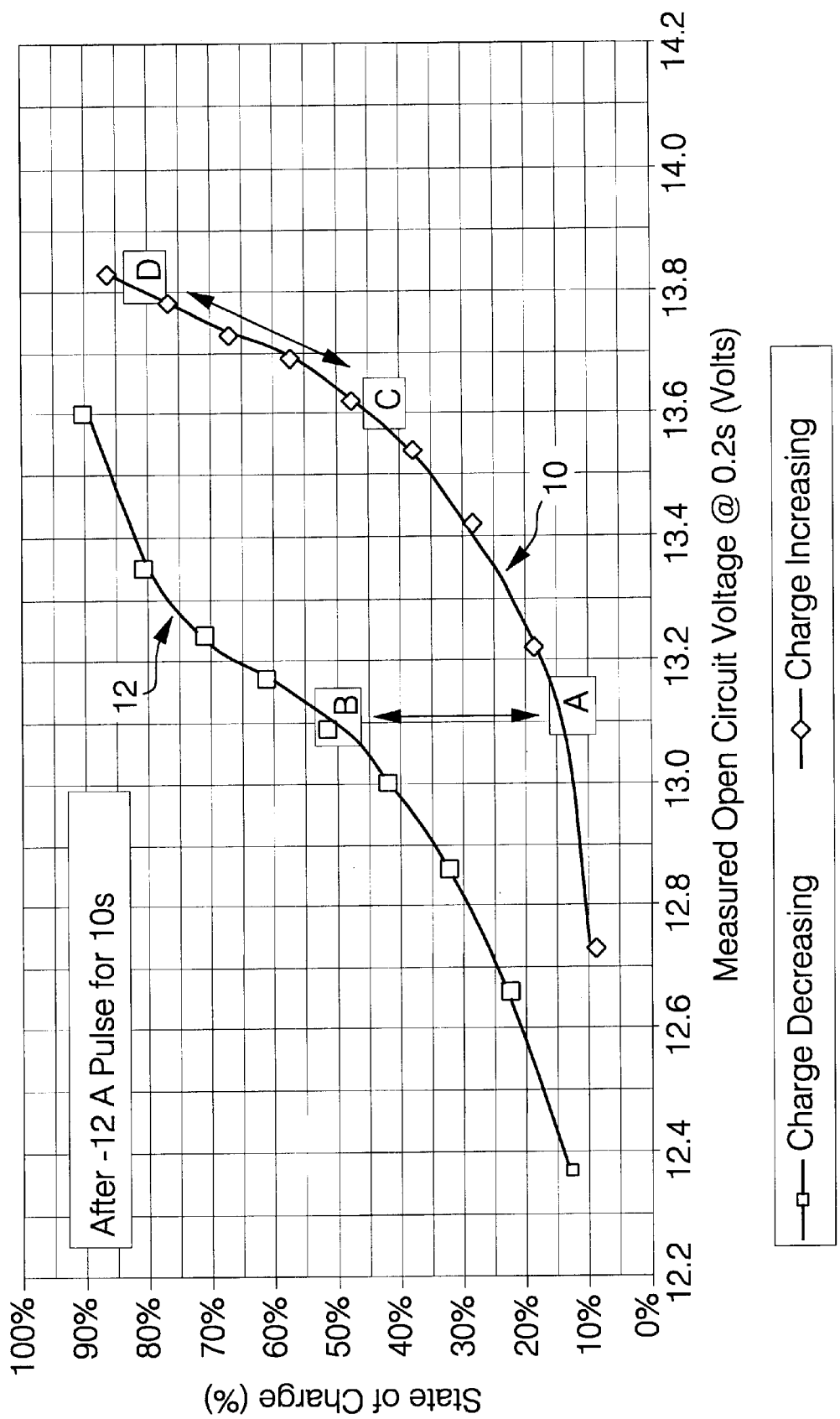
FIG. 1 is a diagrammatic drawing of a NiMH battery potential for slow rates of charge (upper curve) and discharge (lower curve)
Figure 2:
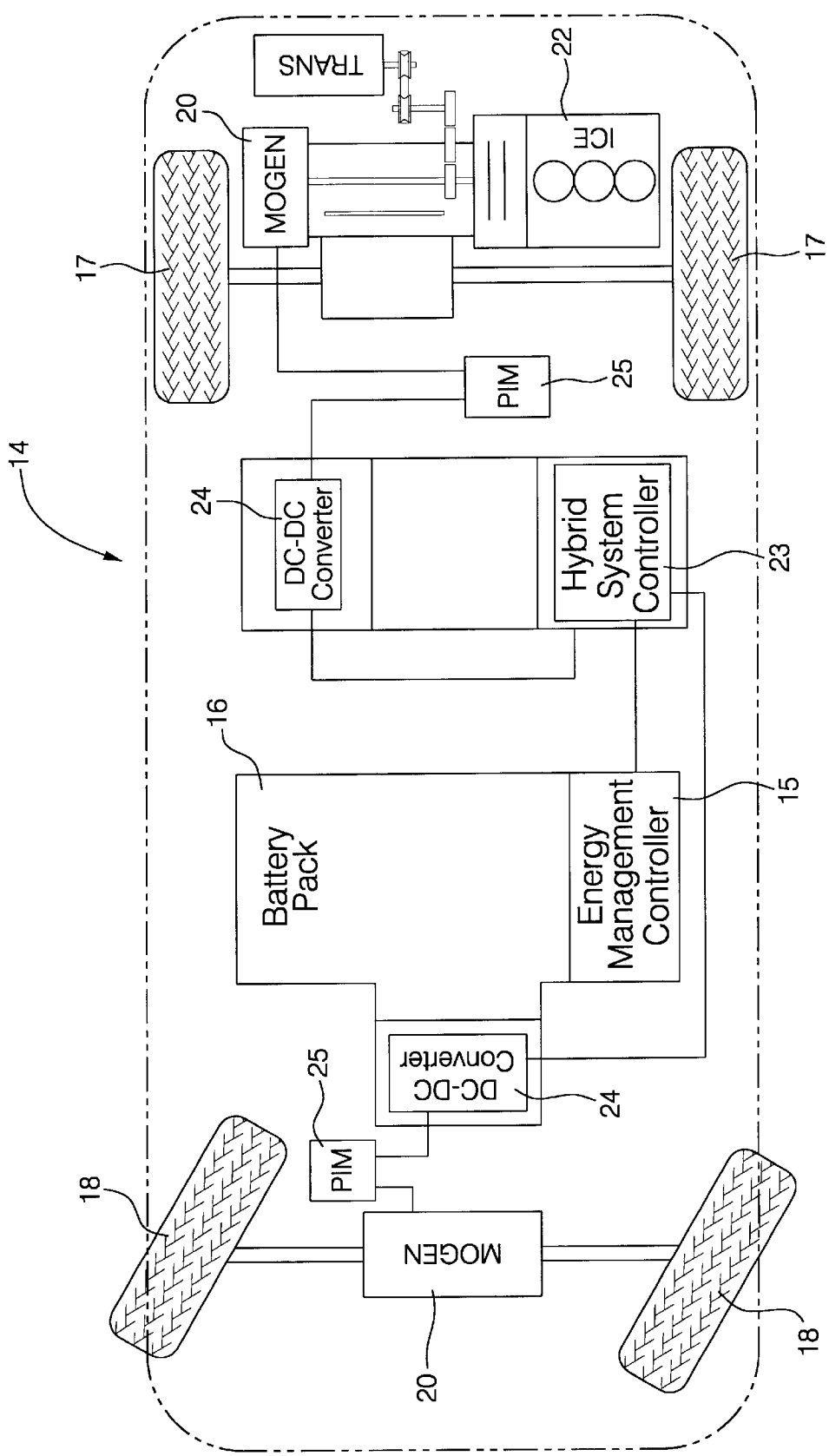
FIG. 2 is a diagrammatic drawing of the hybrid vehicle of the present invention.

FIG. 2 is a diagrammatic drawing of a hybrid vehicle 14 of the present invention. The hybrid vehicle 14 includes a battery pack 16 having a single battery module or individual battery modules. In the preferred embodiment, the battery pack 16 comprises a plurality of NiMH battery modules connected in series to produce a 376 V nominal system voltage. In alternate embodiments of the present invention, the battery pack 16 may comprise any known battery technology, including but not limited to lead acid, lithium ion, and lithium polymer batteries.

A motor generator (MoGen) 20 is dynamically coupled to an internal combustion engine (ICE) 22 and functions as either a motor to propel the vehicle 14 or a generator to charge the battery pack 16, depending on the operating state of the vehicle 14 (i.e., braking, stopped, or operating at a constant speed on a highway). The MoGen 20 is preferably an AC induction machine but may comprise any known electrical motor/generator technology, including, but not limited to, DC machines, synchronous machines, and switched reluctance machines. The MoGen 20 in the preferred embodiment is located on the rear of the vehicle to drive the rear wheels 17. A MoGen 20 is also located on the front of the vehicle to drive the front wheels 18.

The MoGens 20 are controlled by an electrical control system comprising of a hybrid system controller 23, DC-DC converters 24 and power inverter modules 25. In alternate embodiments of the present invention, the controller 23, DC-DC converters 24, and power inverter modules 25 may be configured as a unitary system. The hybrid system controller 23 may comprise any type of control module or vehicle controller known in the art, and is equipped with nonvolatile memory (NVM), random access memory (RAM), discrete and analog input/output (I/O), a central processing unit, communications interfaces for networking within an automotive communications network, etc.

The MoGens 20 in generator mode generate electrical energy that is transferred to the battery pack 16 and the DC-DC converters 24 by the controller 23 and inverter modules 25. The controller 23 and inverter modules 25 determine the direction of current flow for the MoGens 20, according to the vehicle 14 operating state. The DC-DC converters 24 provide and regulate the DC bus that is pulse-width-modulated, or modulated in any other known manner, by the inverter modules 25 to supply time varying voltage/current to the MoGens 20. In a regeneration state (such as during braking) or a charging condition, current will flow from the MoGens 20, via the inverter modules 25, to charge the battery pack 16 and provide current to the DC-DC converters 24. In a state where the MoGens 20 are needed to provide propulsion, current will flow from the battery pack 16 to the MoGens 20, via the DC-DC converters 24 and inverter modules 25, to power the MoGens 20.

In the preferred embodiment of the present invention, the SOC of the battery pack 16 is dynamically tracked to determine when to charge the battery pack 16. The hybrid controller 23 of the present invention will control the battery pack's state-of-charge (SOC) so as to range between 30% and 70% such that the charge acceptance and efficiency during regenerative braking can be realized, and sufficient discharge power can be delivered; however, controlling the battery pack 16 to any SOC percentage is within the scope of the present invention.

The methods executed by the controller 23 to determine the SOC of the battery pack 16 include any multi-variable regression of interrelated data for the various states-of-charge used for data gathering, such as an algorithm that utilizes coulomb integration and a voltage-based model to extract a battery's SOC from recorded current and potential data or state estimation, for example.

Figure 3:
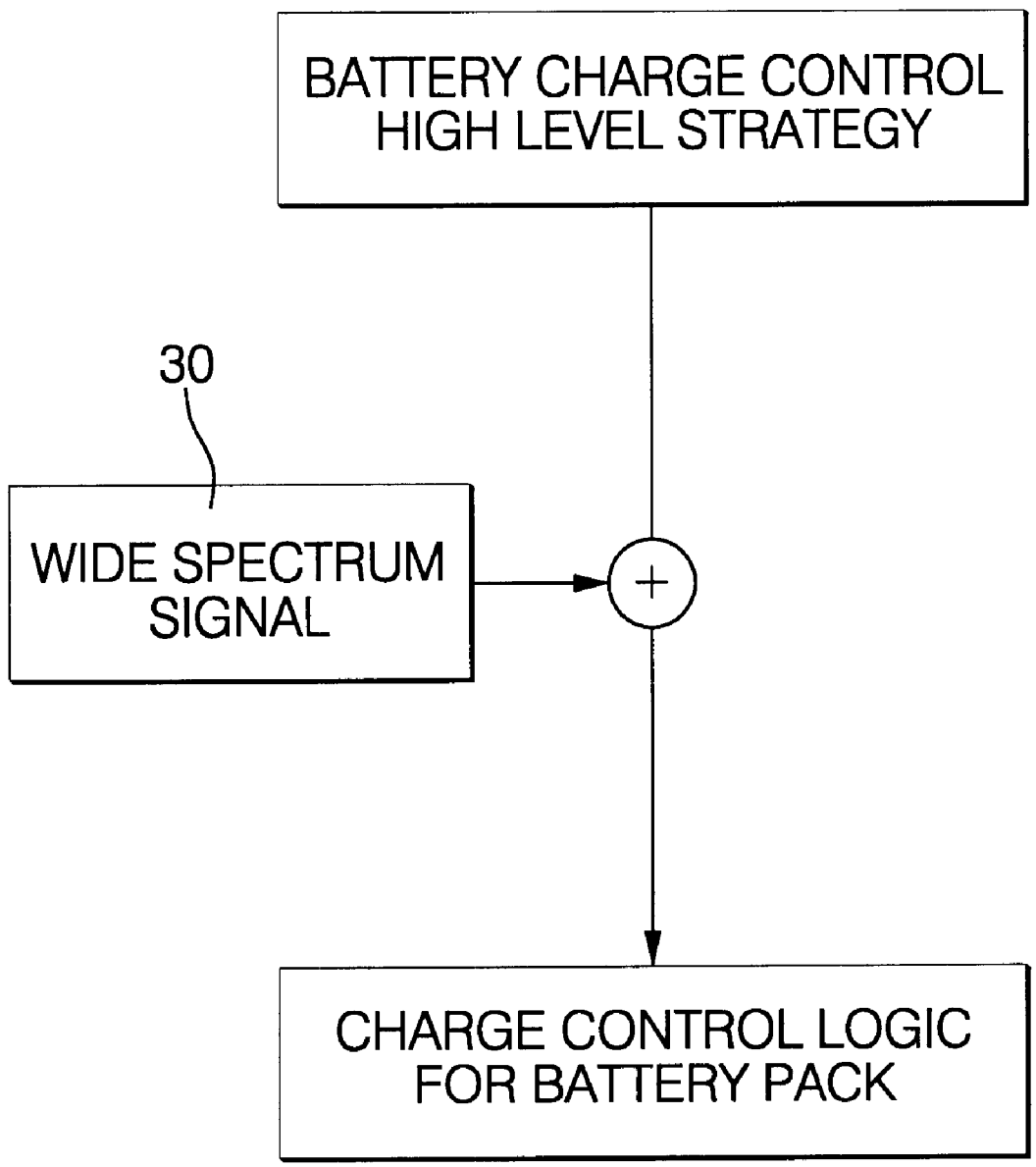
FIG. 3 is a flowchart illustrating the preferred method of the present invention.

To estimate the SOC of the battery pack 16, SOC algorithms relying on optimization criteria to determine battery states produce the best results when the battery pack 16 is excited by random noise. In normal vehicle operation, the battery excitation has a limited spectrum, and information about the battery may be unavailable or is limited at best. To improve availability and accuracy of the criteria to determine SOC, the method of the present invention illustrated in FIG. 3 introduces a random noise or wide spectrum signal 30 onto the excitation of the battery pack 16 through the controller 23. The random noise 30 introduces significant AC content over a wide spectrum. The random noise 30 is produced by the hybrid controller 23 via a random sequence superimposed on the desired charging setpoint. This excitation is performed without affecting normal vehicle characteristics or qualities of the vehicle and illuminates the response of the battery. The noise or signal thus generates a response of the battery that reveals battery performance and characteristics. The signal or random noise 30 may be of any form, such as white noise, true random noise, chirp, swept sinusoidal or a pseudo random signal, for example.

Injection of the random noise 30 signal onto the battery is continuous during vehicle operation and is performed by the hybrid controller 23 when the MoGens 20 are in generator mode. The random noise 30 excites the amplitude across the battery to the highest value possible without affecting driveability or efficiency of the vehicle. Improving the SOC of the battery in an electronic vehicle (EV) is also possible implementing the above method.

Alternatively, random noise is injected across the alternator of the ICE when the ICE is driving the vehicle. Determination of the SOC of the battery of the ICE by the electrical control system is improved where the impedance of the battery can now be measured more accurately across the wide spectrum.

Additionally, successful SOC measurement of a conventionally powered vehicle using an ICE can be retrofitted by modifying the existing controller software programming to introduce a wide spectrum signal into the preset charging setpoint. As above, this causes a constantly changing current at the battery terminals and increases AC content. The wide spectrum signal illuminates the battery response for increased availability and more accurate impedance measurements.

While this invention has been described in terms of some specific embodiments, it will be appreciated that other forms can readily be adapted by one skilled in the art. Accordingly, the scope of this invention is to be considered limited only by the following claims.

What is claimed is:

1. A method of improving estimation of battery impedance for determining the state of charge of a battery comprising:
    injecting an electrical signal across said battery when said battery is in discharge mode; and
    providing a powertrain controller including:
        a power inverter coupled to said battery;
        a controller controlling said power inverter, said controller monitoring the state of charge of said battery; and
        a state of charge algorithm included in said controller, wherein said step of injecting an electrical signal is performed by said controller for providing accurate criteria to said state of charge algorithm.

2. The method of claim 1, wherein said battery is a battery pack comprising a nickel metal hydride battery.

3. The method of claim 1, said vehicle powertrain control system further comprising a motor/generator coupled to said inverter.

4. The method of claim 1, wherein the step of injecting said signal is continuous during operation of said powertrain control system.

5. The method of claim 1, wherein said electrical signal is white noise.

6. The method of claim 1, wherein said electrical signal is true random noise.

7. The method of claim 1, wherein said electrical signal is chirp.

8. The method of claim 1, wherein said electrical signal is swept sinusoidal.

9. The method of claim 1, wherein said electrical signal is pseudo random noise.

10. A method of improving estimation of battery impedance for determining the state of charge of a battery of an internal combustion engine comprising injecting an electrical signal across an alternator coupled to said engine.

11. The method of claim 10, wherein the step of injecting said signal is continuous during operation of said internal combustion engine.

12. The method of claim 10, wherein said electrical signal is white noise.

13. The method of claim 10, wherein said electrical signal is true random noise.

14. A vehicle powertrain control system comprising:
    a battery pack;
    a power inverter coupled to said battery pack;
    a controller controlling said power inverter, said controller monitoring the state of charge of said battery pack; and
    an electrical signal generated by said controller for implementing said monitoring of the state of charge of said battery pack.

15. The vehicle powertrain control system of claim 14, wherein said battery pack comprises a nickel metal hydride battery.

16. The vehicle powertrain control system of claim 14, further comprising a motor/generator coupled to said inverter.

17. The vehicle powertrain control system of claim 14, wherein said electrical signal is white noise.

18. The vehicle powertrain control system of claim 14, wherein said electrical signal is true random noise.

19. A method of improving estimation of battery impedance for determining the state of charge of a battery of an electronic vehicle comprising injecting an AC electrical signal across said battery, wherein said electronic vehicle further comprises:
    a battery;
    a power inverter coupled to said battery; and
    a controller controlling said war inverter, said controller monitoring the state of charge of said battery.

20. The method of claim 19, wherein said step of injecting an AC electrical signal is performed by said power inverter when said battery is discharging.

21. The method of claim 19, wherein said step of injecting a wide spectrum signal is performed by said power inverter when said battery is in a regeneration or a charging state.

22. The method of claim 19, further comprising charging said battery while monitoring the state of charge of said battery.

23. The method of claim 19, wherein said AC electrical signal is white noise.

24. A method for improving estimation of battery impedance for determining the state of charge of an electronic apparatus having a battery pack, a power inverter coupled to the battery pack, and a controller controlling the power inverter, comprising the steps of:
    monitoring the state of charge of said battery pack by said controller, and
    injecting a time varying electrical signal across said battery pack.

25. The electronic apparatus of claim 24, wherein injecting said time varying electrical signal is performed by said controller.

26. The method of claim 24, wherein injecting said time varying electrical signal further comprises modulating the load across said battery pack.

27. The method of claim 24, further comprising:
    charging said battery; and
    modulating said charging step by said controller.

28. The method of claim 24, further comprising modulating the processing speed of said controller and influencing the power draw of said battery pack.

* * * * *